(12) United States Patent
Chen et al.

(10) Patent No.: US 10,170,312 B2
(45) Date of Patent: Jan. 1, 2019

(54) SEMICONDUCTOR SUBSTRATE AND MANUFACTURING METHOD OF THE SAME

(71) Applicant: TAIWAN SEMICONDUCTOR MANUFACTURING COMPANY LTD., Hsinchu (TW)

(72) Inventors: Pu-Fang Chen, Hsinchu (TW); Wei-Zhe Chang, Hsinchu (TW); Shi-Jieh Lin, Hsinchu (TW); Victor Y. Lu, Foster City, CA (US)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 15/492,410

(22) Filed: Apr. 20, 2017

(65) Prior Publication Data

US 2018/0308697 A1    Oct. 25, 2018

(51) Int. Cl.
*H01L 21/22* (2006.01)
*H01L 21/02* (2006.01)
*H01L 29/32* (2006.01)

(52) U.S. Cl.
CPC .... *H01L 21/2205* (2013.01); *H01L 21/02021* (2013.01); *H01L 21/02024* (2013.01); *H01L 21/02052* (2013.01); *H01L 21/0262* (2013.01); *H01L 21/02087* (2013.01); *H01L 21/02164* (2013.01); *H01L 21/02274* (2013.01); *H01L 21/02532* (2013.01); *H01L 21/02595* (2013.01); *H01L 21/02658* (2013.01); *H01L 29/32* (2013.01)

(58) Field of Classification Search
None
See application file for complete search history.

(56) References Cited

U.S. PATENT DOCUMENTS

| | | | | |
|---|---|---|---|---|
| 2002/0179006 A1* | 12/2002 | Borgini | ............ | H01L 21/3225 117/95 |
| 2009/0017291 A1* | 1/2009 | Sadamitsu | ............ | C30B 15/00 428/336 |
| 2010/0155728 A1* | 6/2010 | Cha | ............ | H01L 21/02381 257/49 |
| 2013/0049005 A1* | 2/2013 | Chua | ............ | H01L 33/0079 257/76 |

* cited by examiner

*Primary Examiner* — Kimberly N Rizkallah
*Assistant Examiner* — Bo B Jang
(74) *Attorney, Agent, or Firm* — WPAT, P.C., Intellectual Property Attorneys; Anthony King

(57) ABSTRACT

Present disclosure provides a method for manufacturing a semiconductor wafer with an epitaxial layer at a front surface of the semiconductor wafer, including providing the semiconductor wafer with a first dopant concentration of a dopant having a first conductivity type, forming a polysilicon layer over the front surface, removing the polysilicon layer from the front surface, and depositing the epitaxial layer at the front surface with a second dopant concentration of the dopant having the first conductivity type under a predetermined temperature. A transition width of the dopant having the first conductivity type across the semiconductor wafer and the epitaxial layer is controlled by the predetermined temperature to be at least about 0.75 micrometer. A semiconductor device and a semiconductor wafer with an epitaxial layer at a front surface of the semiconductor wafer are also disclosed.

20 Claims, 12 Drawing Sheets

SEMICONDUCTOR SUBSTRATE AND MANUFACTURING METHOD OF THE SAME

BACKGROUND

A semiconductor wafer which is intended to be suitable in particular for the fabrication of electronic components with line widths of less than or equal to 0.13 μm must have a large number of special properties. Taking a bipolar IC as a typical example of their applications, those under use are the semiconductor wafer by the vapor-phase growing of an epitaxial layer of doped silicon having a thickness of several micrometers on a mirror-polished wafer of low-resistivity grade. The number of crystal defects in such semiconductor wafer on which semiconductor components are intended to be produced is critical to the semiconductor device yield. When crystal defects are present in a certain number and size, crystal defects can lead to the failure of the components.

On the other hand, the film thickness of the epitaxial layer of silicon is, though widely varied depending on the intended particular application field, in the range from 1 to 15 μm for the bipolar ICs and bipolar CMOSs as an example for those having a relatively small thickness or several tens of μm for the discrete as those having a relatively large thickness and, as a trend in recent years, those under manufacturing include those of the submicron range having a thickness not exceeding 1 μm for the small thickness and those exceeding 100 μm for IGBTs for the large thickness.

Preparation of the aforesaid semiconductor wafer with an epitaxial layer is performed in such a way that a silicon single crystal rod pulled up by the Czochralski method from a melt of silicon admixed in advance with a dopant so as to give a specified type of electro conductivity and appropriate resistivity is subjected to cylindrical grinding with the axial line of the direction of pulling up as the axis of rotation followed by a shaving work on the cylindrical periphery along the direction of the axial line to serve as an orientation flat of the wafers and then slicing in a direction perpendicular to the axis of the rod to give sliced wafers from which a chemically etched wafer is obtained after the works such as chamfering, lapping on both flat surfaces, chemical etching and the like and the chemically etched wafer is subjected to mirror polishing.

There is a need to produce a semiconductor wafer with an epitaxial layer formed on an active surface thereof and having sufficient low crystal defect density so as to raise the semiconductor device yield.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

Like reference symbols in the various drawings indicate like elements.

DETAILED DESCRIPTION OF THE DISCLOSURE

Figure 1:
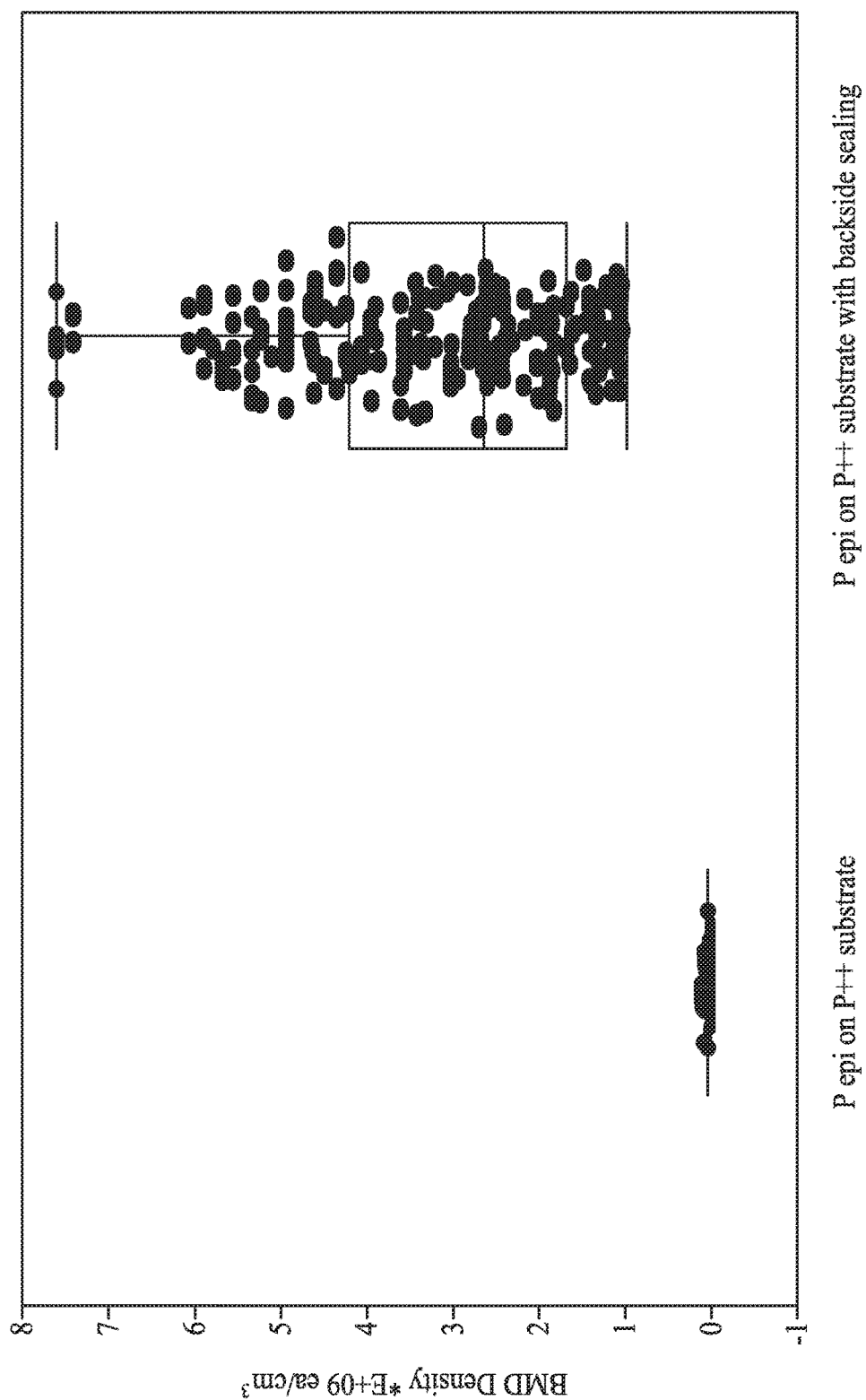
FIG. 1 is a diagram showing density of bulk micro defects (BMDs) with respect to different wafer types, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Grown-in defects existing inside a crystal just after silicon single crystal growth, oxygen precipitates, dislocations induced in device production process, and stacking faults, etc. deteriorate device characteristics. On the other hand, it is known that oxygen precipitates can be utilized effectively as a gettering site of heavy metals and increase the mechanical strength of the substrate, and thus they are considered as indispensable impurities at present, and control of these crystal defects is very important.

"Bulk Micro Defects (BMDs)" is a term commonly used to refer to oxygen precipitates in silicon. In fact, many imperfections in the silicon lattice create defects, and BMDs could be any imperfections including oxygen precipitates, voids, inclusions, slip lines, etc. BMDs go by many names, referring to the problems they cause, how they were created, or their physical characteristics. Examples include COPs (Crystal Originated Particles) and Grown-In Defects. Imperfections in the lattice of a semiconductor and impurities create energy states in the bandgap, decrease carrier lifetime, and increase junction leakage. They also act as gettering sites at which impurities tend to concentrate. The profile of BMDs is often controlled so that the surface layer silicon, where the MOS transistor action takes place, is free of oxygen precipitates, and the oxygen precipitates in the underlying silicon acts as a gettering site to keep impurities away from the MOS transistors.

Autodoping refers to the incorporation of dopant originating from the substrate into the epitaxial layer. Autodoping is a problem that occurs in silicon wafers that are used for epitaxial deposition. During the heat cycle of the epitaxial process, the highly doped (p+ or p++) silicon substrates diffuse out dopant atoms through the backside of the substrate leading to an unintentional overdoping effect on the wafer front side. This is most noticeable at the edge of the wafer. This leads to an inhomogeneity in the epitaxial dopant profile beyond the tolerance of most device manufacturers.

Polysilicon and oxide backside sealing for manufacturing the aforesaid highly doped semiconductor substrate effectively prevents the autodoping phenomenon but it is observed that the BMDs density being significantly increased in such backside sealing semiconductor substrate. Referring to FIG. 1, FIG. 1 is a diagram showing density of bulk micro defects (BMDs) with respect to different wafer types. One type of the wafer is a p-type epitaxial layer deposited over a p++ substrate (hereinafter "type 1 wafer"), and the other type of the wafer is a p-type epitaxial layer deposited over a p++ substrate, in which the p++ substrate has gone through a backside sealing operation before the formation of the p-type epitaxial layer (hereinafter "type 2 wafer"). It is shown that each of type 1 wafers has a low and uniform BMD density, whereas some of the type 2 wafers have a high and a wide spread BMD densities. In some embodiments, present disclosure is to provide a semiconductor substrate (also refer to a semiconductor wafer herein) with backside sealing to prevent autodoping, possessing a low BMDs density down to 1E9 each/cm$^3$ (from a cross sectional perspective) and an average BMDs size smaller than 60 nm at a center portion of the semiconductor substrate. Present disclosure also provides a semiconductor substrate with backside sealing to prevent autodoping, possessing a low BMDs density down to 5E8 each/cm$^3$ (from a cross sectional perspective) and an average BMDs size smaller than 55 nm at an edge portion of the semiconductor substrate as opposed to the center portion of the semiconductor substrate. The semiconductor devices fabricated by the aforesaid semiconductor substrate (or semiconductor wafer) also demonstrate the aforesaid BMD features. The manufacturing method of the semiconductor substrate (or semiconductor wafer) is also disclosed.

For illustration purpose, the conductive type referred herein is majorly directed to p-type, however, the scope of the present disclosure encompasses both the p-type and n-type embodiments.

Figure 2:
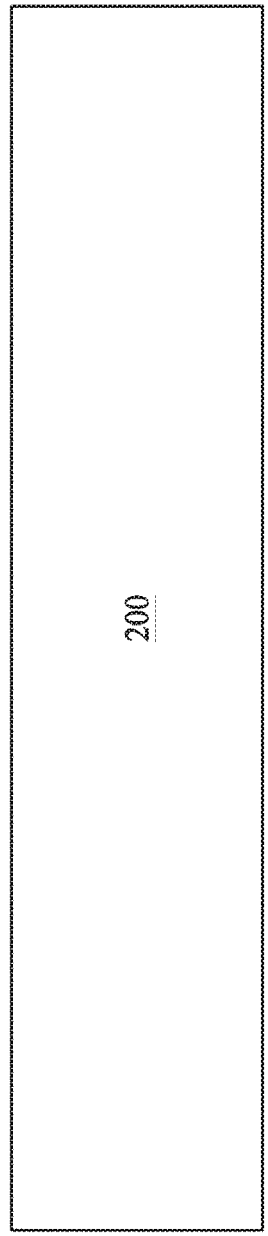
FIGS. 2-7 are cross sectional views of a semiconductor device being manufactured in various stages of operation, in accordance with some embodiments of the present disclosure.

Referring to FIGS. 2-7, FIGS. 2-7 are cross sectional views of a semiconductor device being manufactured in various stages of operation. FIG. 2 shows a p-type semiconductor wafer 200. In some embodiments, the semiconductor wafer 200 is a wafer-like body which is composed of a material which can be machined and epitaxially coated by the chemo-mechanical double-side polishing process used. Silicon in monocrystalline form with a crystal orientation (100), (110) or (111), for example crystallized by a Czochralski or float zone refining process, is preferred. In this case, the silicon contains a certain amount of dopant. A distinction is made between dopants from the 3rd main group of the Periodic Table of the Elements, for example boron, which leads to p-type material. Dopants which are elements from the 5th main group of the Periodic Table of Elements, for example phosphorus, arsenic or antimony, lead to n-type material. Of course, the present disclosure can be applied not only to the production of wafers made of a homogeneous material but also to the production of semiconductor substrates constructed in a multilayer manner. Examples of multilayer wafers include SOI (silicon-on-insulator) wafers and so-called bonded wafers.

In some embodiments, the semiconductor wafer 200 has been separated from a single silicon crystal which has been cut to length and undergone a circular grinding and the front and/or back surfaces of which have undergone a surface-grinding step. If desired, the crystal may be provided with one or more orientation features in order to be able to identify the crystal axes, for example a notch and/or a flat. The edge of the semiconductor wafer may likewise be rounded at a suitable point in the process sequence by means of a suitably profiled grinding wheel. Moreover, it is possible for the surface of the semiconductor wafer to be etched after the grinding step.

Figure 3:
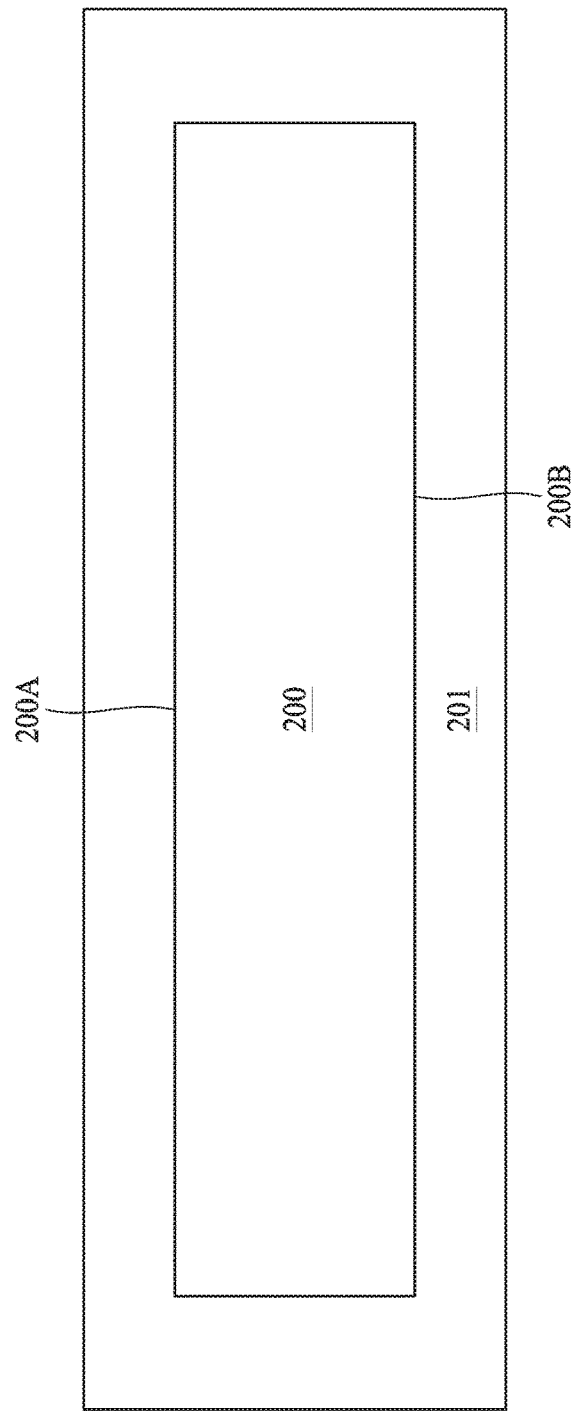

FIG. 3 shows a deposition of a polysilicon layer 201 over a front surface 200A and a back surface 200B of the semiconductor wafer 200. Preferably the thickness of the polysilicon layer 201 is between 0.5 and 2 microns. The polysilicon layer acts as an external gettering for impurity and metal contamination. In some embodiments, forming a gettering layer is by depositing polycrystalline silicon on the front surface 200A and a back surface 200B of the semiconductor wafer 200 through use of low-pressure chemical vapor deposition (the low-pressure CVD method). In some embodiments, in order to improve the gettering capability, there has been proposed a method of depositing amorphous silicon in place of the polycrystalline silicon.

Figure 4:
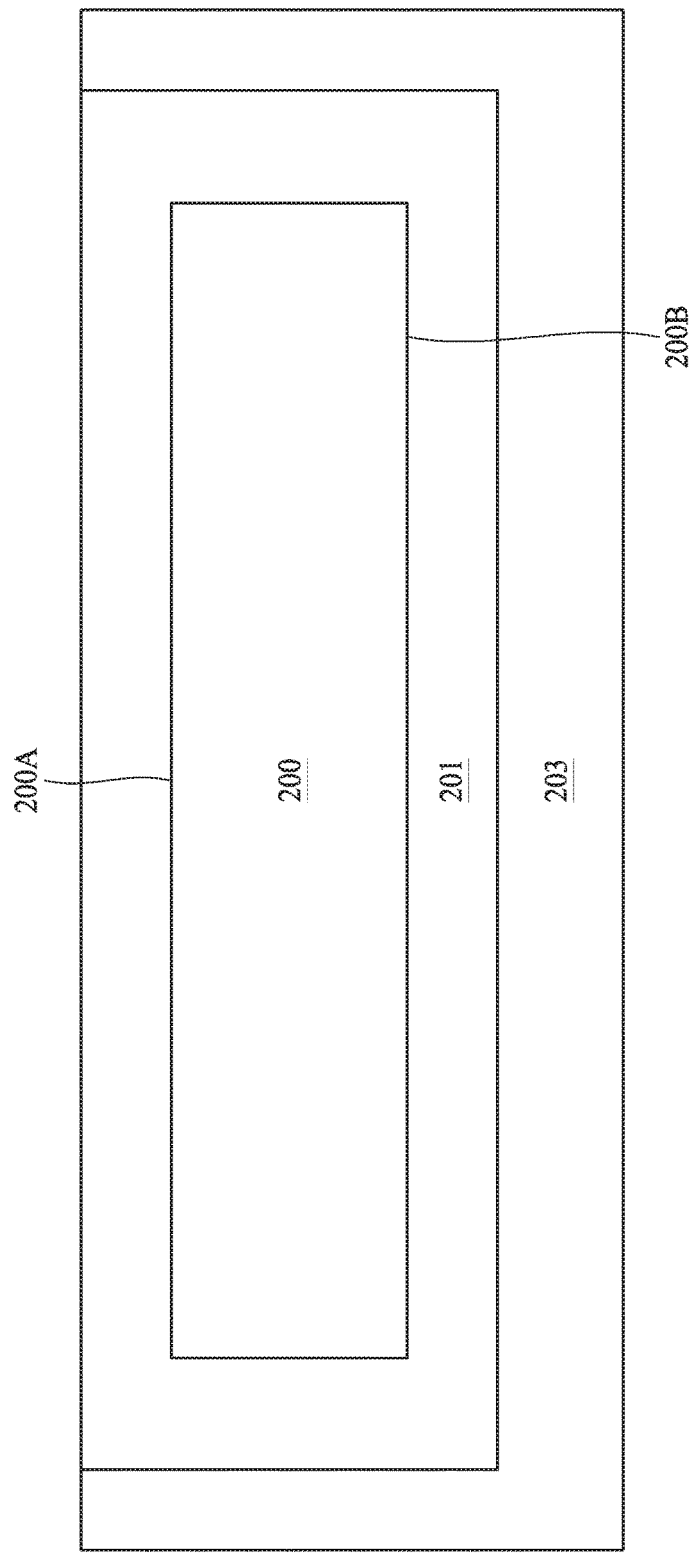

FIG. 4 shows an oxide layer 203 formation on an edge 200C and the back surface 200B of the semiconductor wafer 200. The present operation is particularly suitable for the production of silicon wafers with diameters of, in particular, 200 mm, 300 mm, 400 mm and 450 mm and thicknesses of a few 100 μm to a few cm, preferably 400 μm to 1200 μm. Various technologies are used for the deposition of the oxide layer 203, for example, a SiO$_2$ layer. These can roughly be divided into atmospheric and low-pressure applications and further into processes that utilize the ignition of plasma (plasma enhanced: PE) in chemical vapour deposition (CVD), which makes used of pyrolytic surface-catalysis of silicon and oxygen bearing carrier gases.

In some embodiments, a single low temperature oxide (LTO) layer on the backside of a wafer using Low Pressure Plasma Enhanced Chemical Vapour Deposition (LPPECVD).

In some embodiments, a double low temperature oxide (LTO) layer on the backside of a wafer using Low Pressure Plasma Enhanced Chemical Vapour Deposition (LPPECVD). A first layer of the double LTO is a low stress LTO layer formed using high frequency RF at high power with high silane (SiH$_4$) flow. A second layer of the double LTO is a high stress LTO layer deposited using both high and low frequency RF at high power to provide a high density LTO layer with low etch rate during subsequent cleaning processes.

The low stress LTO layer controls the geometry of the wafer to minimize wafer warpage. The low stress LTO layer further acts to improve epi-haze during epitaxy. The high stress LTO layer has high density and therefore a low etch rate. This allows the backside seal to maintain the low stress LTO layer during subsequent cleaning processes as only a small amount of the high stress LTO layer is available for etching. The low stress LTO layer also has high deposition rate, which means a high throughput. A high stress LTO layer with low etch rate provides a reduction in production costs.

When a $SiO_2$ film was formed as a plasma CVD film, monosilane and nitrous oxide were supplied as source materials to a plasma reaction chamber while nitrogen was used as a carrier gas, and the silicon oxide film was deposited until its thickness reached 500 nm at a growth temperature of 425° C. and a growth pressure of 3 torr. At this time, a high frequency power of 700 W was supplied to an upper plate located above a wafer in the plasma reaction chamber, while a low frequency power of 300 W was supplied to a lower plate located below the wafer, so that the stress of the silicon oxide film applied to the wafer became equal to or less than $1\times10^7$ dyne/cm$^2$. In some embodiments, the $SiO_2$ film is formed by thermal oxide growth in a furnace.

Figure 5:
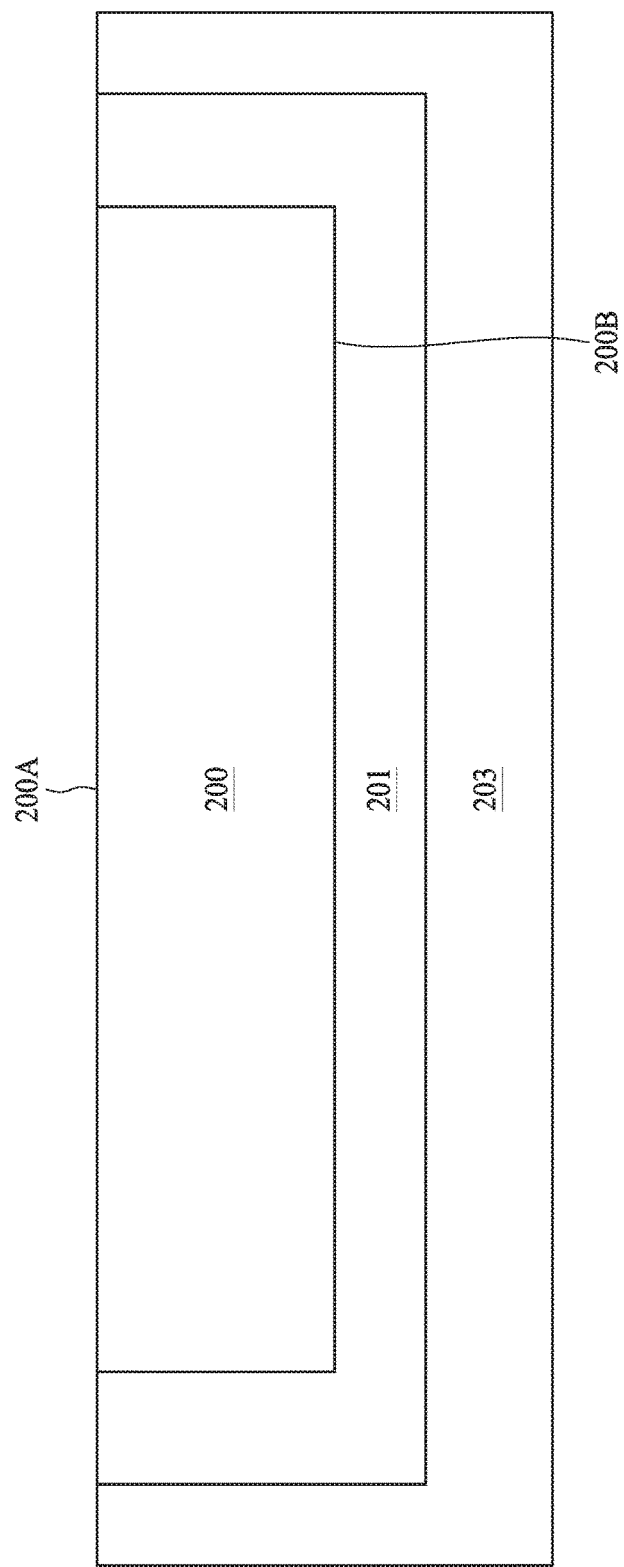

FIG. 5 shows a removal operation of the polysilicon layer 201 from the front surface 200A of the semiconductor wafer 200. After the backside seal is formed on the semiconductor wafer 200, the semiconductor wafer 200 is subjected to a polishing operation to remove polysilicon layer 201 from the front surface 200A and any oxide film on the edge area of the semiconductor wafer 200 and any trace oxide film on the wafer front side.

Since the plasma CVD film deposited on the surface can be polished off at a much higher speed as compared to the case where a thermal oxide film is polished, the plasma CVD film can be easily removed by mirror polishing. Consequently, the flatness of the semiconductor wafer can be maintained.

Following the edge removal process the wafer is subjected to edge polishing and edge polish cleaning. The edge polishing process does not remove any of the oxide layer form the back surface 200B of the semiconductor wafer 200. Edge polish cleaning uses a solution of HF/O$_3$ with HF concentration of typically 0.02 to 0.5%. The edge polish cleaning process typically removes 5-30 nm from the thickness of the oxide layer 203 backside seal.

Figure 6:
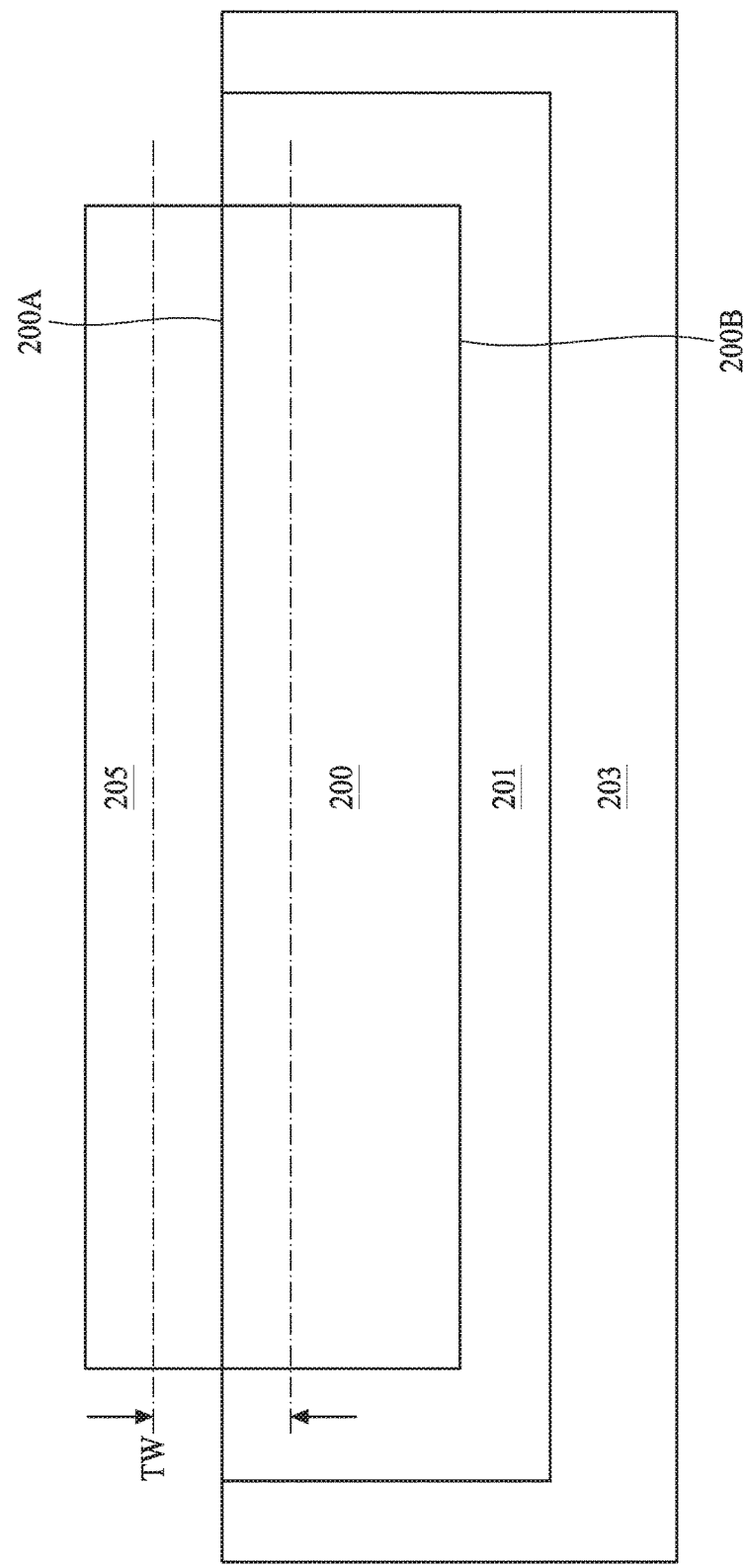

After polishing and polish cleaning a post-polish clean is performed. The post-polish clean further removes some of the oxide layer 203. The concentration of HF in the post-polish clean is typically 0.1-1% resulting in removing typically 10-50 nm of the thickness of the oxide layer 203 backside seal Subsequently, FIG. 6 shows a formation of an epitaxial layer 205 over the front surface 200A of the semiconductor wafer 200. Silicon or silicon/germanium is preferred as the material for the epitaxial coating. By virtue of its dopant content, the epitaxial layer 205 coating, for example, generally differs in its electrical properties from those of the semiconductor wafer 200. For example, the epitaxial layer 205 is less heavily doped than the underlying semiconductor wafer 200. This fact is useful in the construction of integrated semiconductor components. However, this is not absolutely necessary. Moreover, with regard to the planned use of the epitaxially coated semiconductor wafer according to the invention, it might be desired to grow an epitaxial layer without any dopant content, which is likewise possible without causing any problems. Within the scope of the present disclosure, silicon wafers with an epitaxial coating of silicon are particularly preferred, where the silicon wafer and the epitaxial layer are either both of the p-type or both of the n-type.

The silicon wafers 200 that have been treated in accordance with FIG. 2 to FIG. 6 are then provided with an epitaxial silicon layer 205 at least on the front surface 200A according to standard processes. This is preferably done according to the CVD (chemical vapor deposition) process in which silanes, for example silane, $SiH_4$, dichlorosilane, $SiH_2Cl_2$, or trichlorosilane, $SiHCl_3$, are passed to the wafer surface at temperatures of between 1000° C. and 1200° C., preferably between 1120° C. and 1180° C., and most preferably between 1130° C. and 1160° C. In some embodiments, the epitaxial silicon layer 205 is a monocrystalline silicon layer grown in a manner oriented crystallographically on the semiconductor wafer 200. In this case, the naturally occurring Si isotope mixture is preferably used. However, within the scope of the present disclosure, it is likewise possible to use artificially changed Si isotope mixtures or pure Si isotopes. Silicon layer 205 having a thickness of between 1 μm and 5 μm are preferably grown epitaxially. The epitaxial layer may be undoped or doped in a targeted manner, for example with boron, phosphorus arsenic or antimony in order to set the conduction type and the desired conductivity.

Conventionally, a low temperature epitaxial growth process, for example, below 1000° C. is applied in order to obtain a uniform thickness and a uniform resistivity distribution in an epitaxial layer, to reduce a transition width TW (the width of a region which is located in the vicinity of the boundary between an epitaxial layer and a silicon wafer, each having a different dopant concentration, and in which a dopant concentration transits), and to reduce contamination with metal atoms, etc. In order to obtain such a quality, a wafer subjected to a low temperature epitaxial growth process was required to further improve its degree of flatness and reduce its warpage as compared with a wafer to be subjected to a higher temperature epitaxial growth process. However, the low temperature epitaxial growth leads to high BMDs density and thus low device yield as addressed previously. The temperature for epitaxial growth proposed in the present disclosure defeats the conventional wisdom by adopting a relatively high temperature for epitaxial growth, for instance, between 1000° C. and 1200° C., preferably between 1120° C. and 1180° C., and most preferably between 1130° C. and 1160° C., in order to effectively reduce the BMDs density and increase device yield. Critical significance of the preferred epitaxial growth temperature range is discussed in FIG. 8 to FIG. 12 below.

In some embodiments, the cleaned/dried polished silicon wafers were provided with an epitaxially grown silicon layer on the front surface in an epitaxy reactor of the Centura HT308 type from Applied Materials, where $SiHCl_3$ was used as the silicon component and the resistance was set by doping with diborane, $B_2H_6$. At a reactor chamber temperature of 1130° C., an epitaxial silicon layer 205 having a thickness of 4 μm was deposited at a deposition rate of 3 μm/min. In some embodiments, the thickness of the epitaxial silicon layer 205 is at least 4 μm, for example, from about 4 μm to about 10 μm, in order to obtain a sufficient surface flatness.

Figure 7:
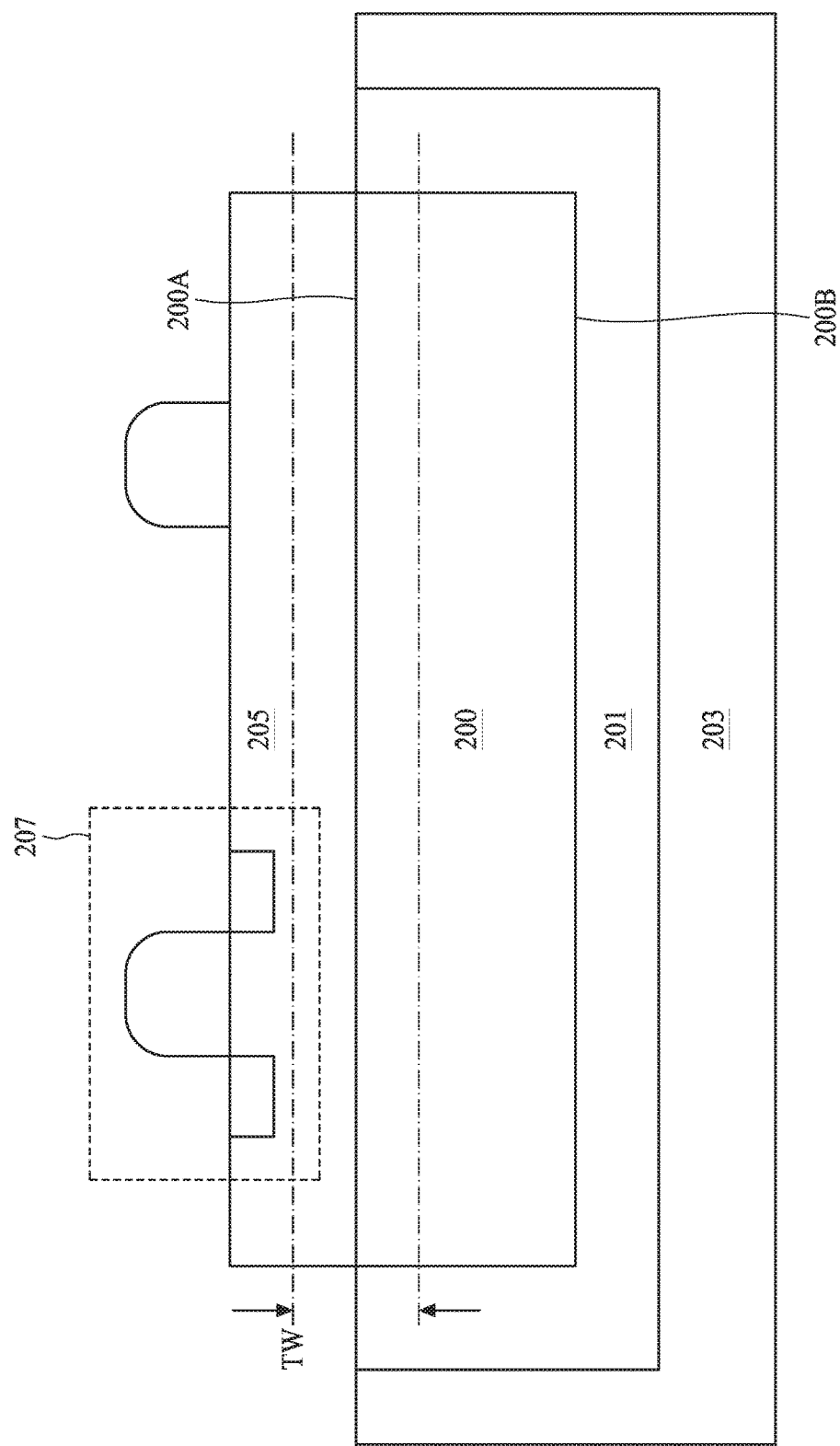
Figure 10:
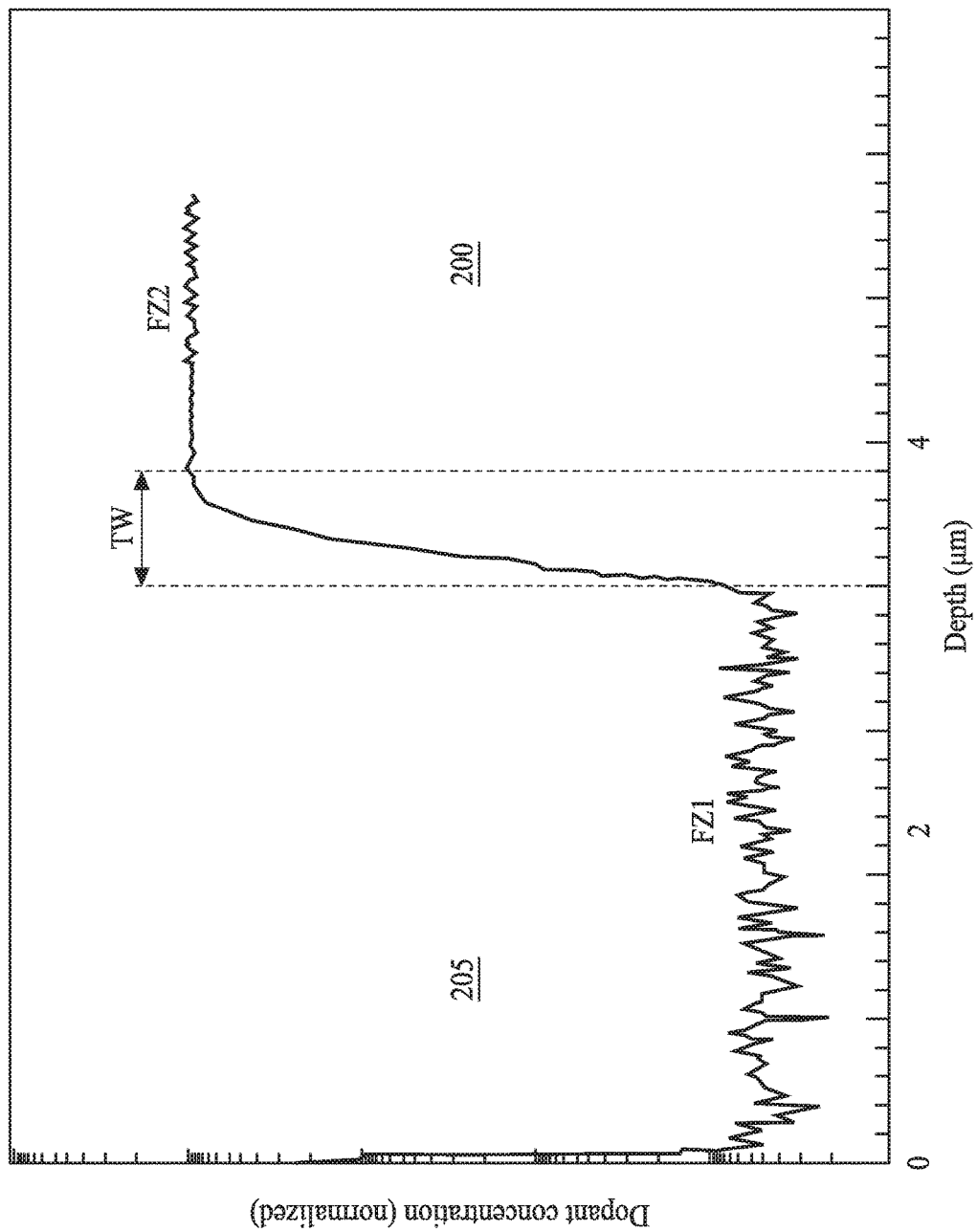
FIG. 10 is a diagram defining a transition width across an epitaxial layer and a semiconductor wafer, in accordance with some embodiments of the present disclosure.

FIG. 7 shows a formation of semiconductor device 207 in the epitaxial silicon layer 205 with a preferred transition width TW equal to or greater than 0.75 μm with a thickness of the epitaxial silicon layer 205 of about 4 μm and a thickens of the semiconductor wafer 200 of about 775 μm. In some embodiments, the transition width TW between a semiconductor wafer 200 and an epitaxial silicon layer 205 is depicted in FIG. 10 of the present disclosure. The transition width is heavily depended on the temperature of epitaxial growth. The temperature of epitaxial growth proposed in the present disclosure demonstrates a range of transition width that is wider than conventional knowledge. Conventional knowledge accepts that if a semiconductor device is fabricated through use of a silicon wafer having an epitaxial layer with a wide transition width, the device fails to exhibit its originally-designed characteristics, thereby rendering the device defective. However, according to the present disclosure, the BMDs density dictates the device yield in a greater proportion than that of the transition width, hence, although having a greater transition width than the conventional art, semiconductor device prepared by the conditions discussed in the present disclosure shows a better device yield. Details of the transition width could be referred to FIG. 10 to FIG. 12 of the present disclosure. In some embodiments, the semiconductor device 207 could be a front-side image sensor having a low device failure rate, for example, lower than 4%.

Figure 8:
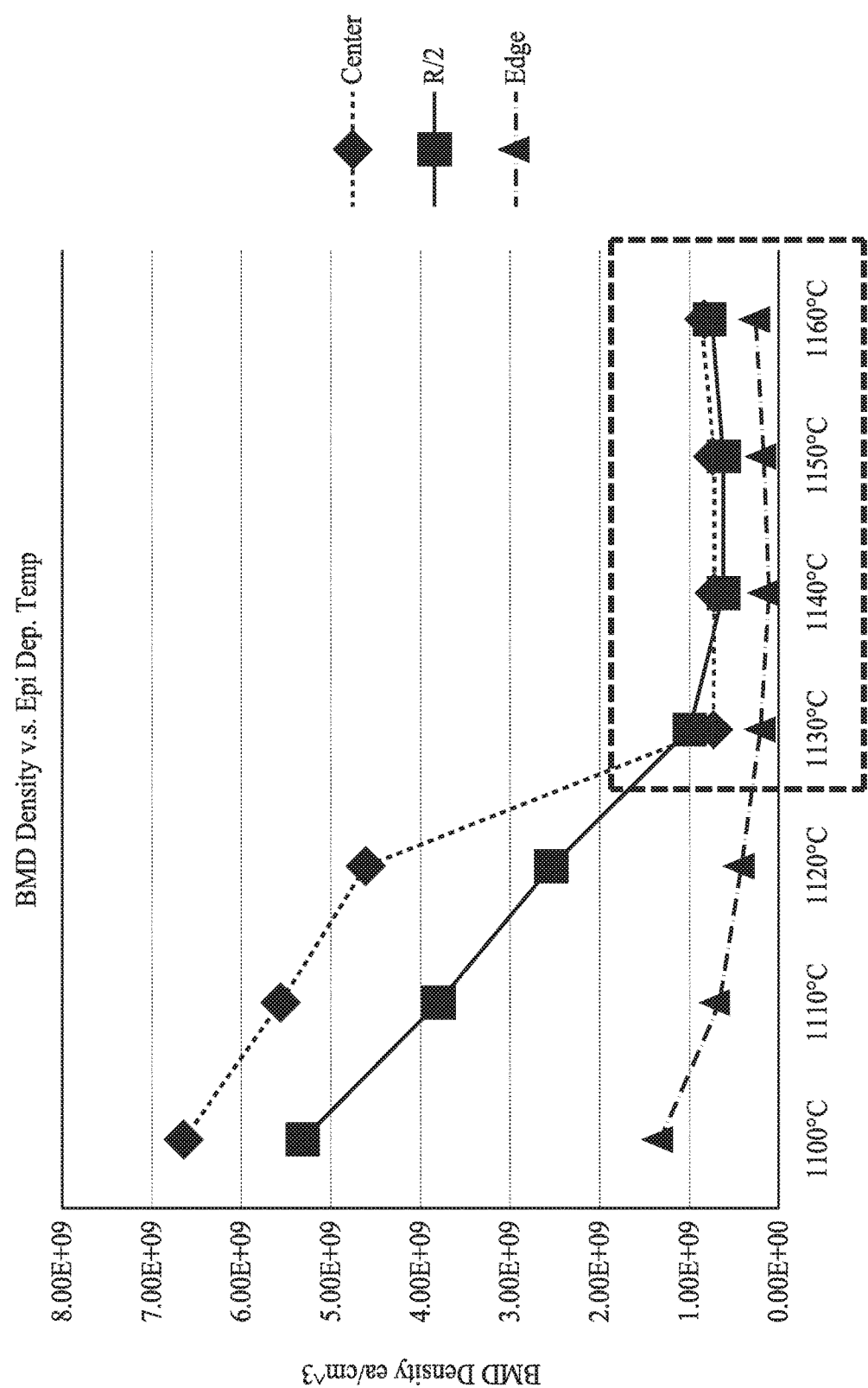
FIG. 8 is a diagram showing density of BMDs with respect to different deposition temperatures for an epitaxial layer over a front surface of the wafer, in accordance with some embodiments of the present disclosure.

FIG. 8 is a diagram showing BMDs density with respect to different epitaxial layer deposition temperatures over the front surface 200A of the semiconductor wafer 200. The BMDs density is measured as follows. First, heat treatment for oxygen precipitation is carried out on the silicon wafer at 800° C. for 4 hours, subsequently at 1000° C. for 16 hours. Then, the semiconductor wafer 200 is cleaved and subjected to a measurement of the BMD density of the semiconductor wafer 200. In-plane positions of measurement points were set from the center to the edge of the semiconductor wafer 200, for example in a 10 mm pitch. In this way, the value of the BMD density is determined. However, the BMDs density can be determined by using other method in the art, for example, infrared (IR) light penetrates most semiconductor materials, and since BMDs alter the local optical properties of a semiconductor, BMDs can be detected by illuminating a sample with IR light and looking at it with a camera that is sensitive to IR.

For a semiconductor device fabricated on the semiconductor wafer 200 described herein, the BMDs density measurement may omit the heat treatment as provided above.

Note in FIG. 8, the BMDs densities are measured in the center and the edge of the semiconductor wafer 200, respectively. An average (R/2) of the BMDs densities measured from the edge and the BMDs measured from the center is calculated using the aforesaid measured data. FIG. 8 shows that when the deposition temperature of the epitaxial layer 205 exceeds 1130° C., the BMDs density measured from the center of the semiconductor wafer 200 abruptly dropped from about $4.6E9/cm^3$ to a value lower than about $1E9/cm^3$. It can also be observed that the BMDs density measured from the edge of the semiconductor wafer 200 gradually decrease along with the increase of temperature of the epitaxial layer 205. According to FIG. 8, the low BMD densities in both the edge and the center of the semiconductor wafer 200 are maintained in a temperature range of from about 1130° C. to about 1160° C.

Figure 9:
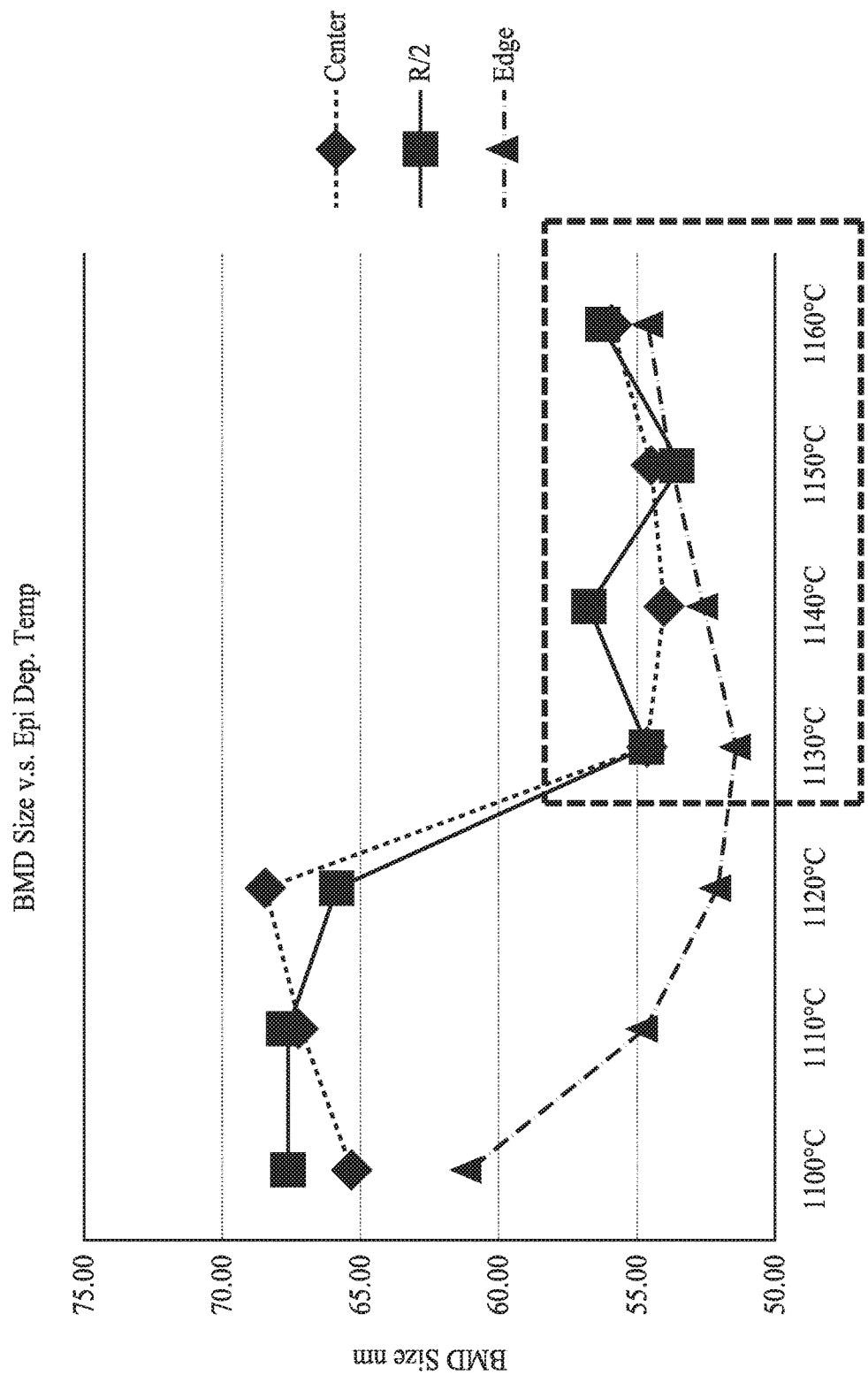
FIG. 9 is a diagram showing BMD size with respect to different deposition temperature for an epitaxial layer over a front surface of the wafer, in accordance with some embodiments of the present disclosure.

FIG. 9 is a diagram showing BMDs size with respect to different deposition temperature for an epitaxial layer 205 over the front surface 200A of the semiconductor wafer 200. An average (R/2) of the BMDs size measured from the edge and the BMDs measured from the center is calculated using the aforesaid measured data. FIG. 9 shows that when the deposition temperature of the epitaxial layer 205 exceeds 1130° C., the BMDs size measured from the center of the semiconductor wafer 200 abruptly dropped from about 68 nm to a value lower than about 60 nm. It can also be observed that the BMDs size measured from the edge of the semiconductor wafer 200 remains under 55 nm along with the increase of temperature of the epitaxial layer 205. According to FIG. 9, the low BMD size in both the edge and the center of the semiconductor wafer 200 are maintained in a range of from about 50 nm to about 60 nm.

According to FIG. 8 and FIG. 9, the deposition temperature for the epitaxial layer 205 over the semiconductor wafer 200 demonstrate a BMDs suppression benefit between 1130° C. to about 1160° C. Not only the BMDs densities across the semiconductor wafer 200 drop, also the BMDs size across the semiconductor wafer 200 decreases, as opposed to the conventional deposition temperature for the epitaxial layer lower than 1130° C.

FIG. 10 is a diagram defining a transition width TW across an epitaxial layer 205 and the front surface 200A of the semiconductor wafer 200. The Y axis of the diagram shows the normalized dopant concentration in both the epitaxial layer 205 and the semiconductor wafer 200. The X axis shows the depth measured from the epitaxial layer 205 toward the semiconductor wafer 200. In some embodiments, a semiconductor device chip measuring 3 mm was cut out of the center of semiconductor wafer 200 on which the epitaxial layers 205 were formed. The surface of the epitaxial layer of the semiconductor device chip was obliquely polished (bevel or angle polishing), and the profile of spreading resistance in the interface between the epitaxial layer and the silicon wafer in the depth wise direction was measured through use of a spreading-resistance measurement instrument, whereby a transition width is obtained.

Transition width TW refers to a region which is located in the vicinity of the boundary between an epitaxial layer 205 and a semiconductor wafer 200, each having a different dopant concentration, and in which a dopant concentration transits. For example, in the present disclosure, the transition width TW is a distance between the flat zone 1 FZ1 in the epitaxial layer 205 and the flat zone 2 FZ2 in the semiconductor wafer 200. In some embodiments, the TW between the epitaxial layer 205 and the semiconductor wafer 200 is more than about 0.75 μm, for example, from about 0.75 μm to about 0.85 μm.

Figure 11:
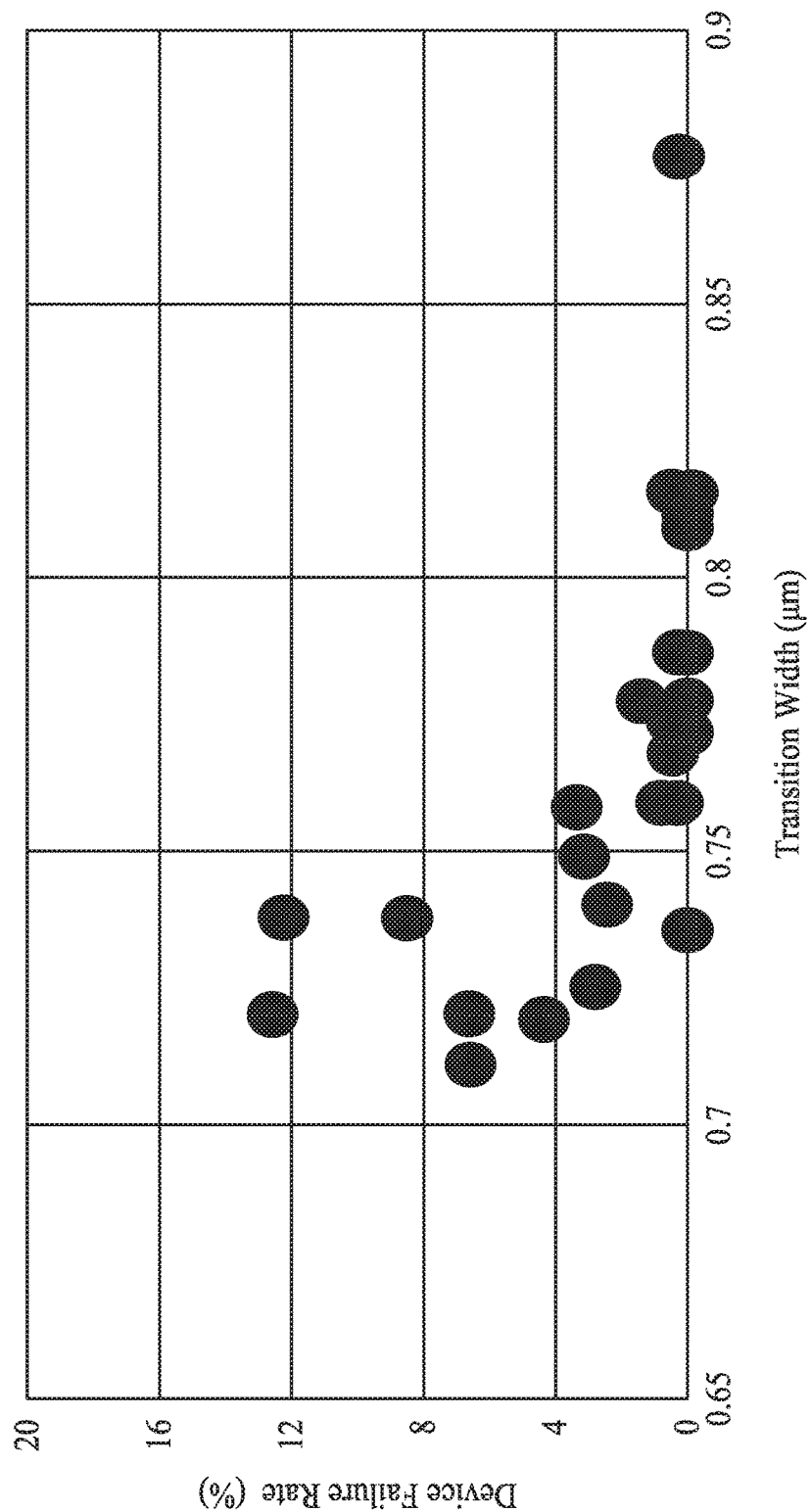
FIG. 11 is a diagram showing device failure rate with respect to transition width, in accordance with some embodiments of the present disclosure.

FIG. 11 is a diagram showing device failure rate with respect to transition width TW. It could be noted in FIG. 11 that once the transition width TW exceeds 0.75 μm, the device failure rate decreases from about 12% to a value lower than about 2%. It is clear that controlling the temperature of the epitaxial layer 205 growth to obtain a transition width TW more than 0.75 μm could effectively decrease the device failure rate for more than 80 percent. The device failure rate retains at a value lower than 2% with transition width TW greater than 0.75 μm, for example, from 0.75 μm to about 0.88 μm.

Figure 12:
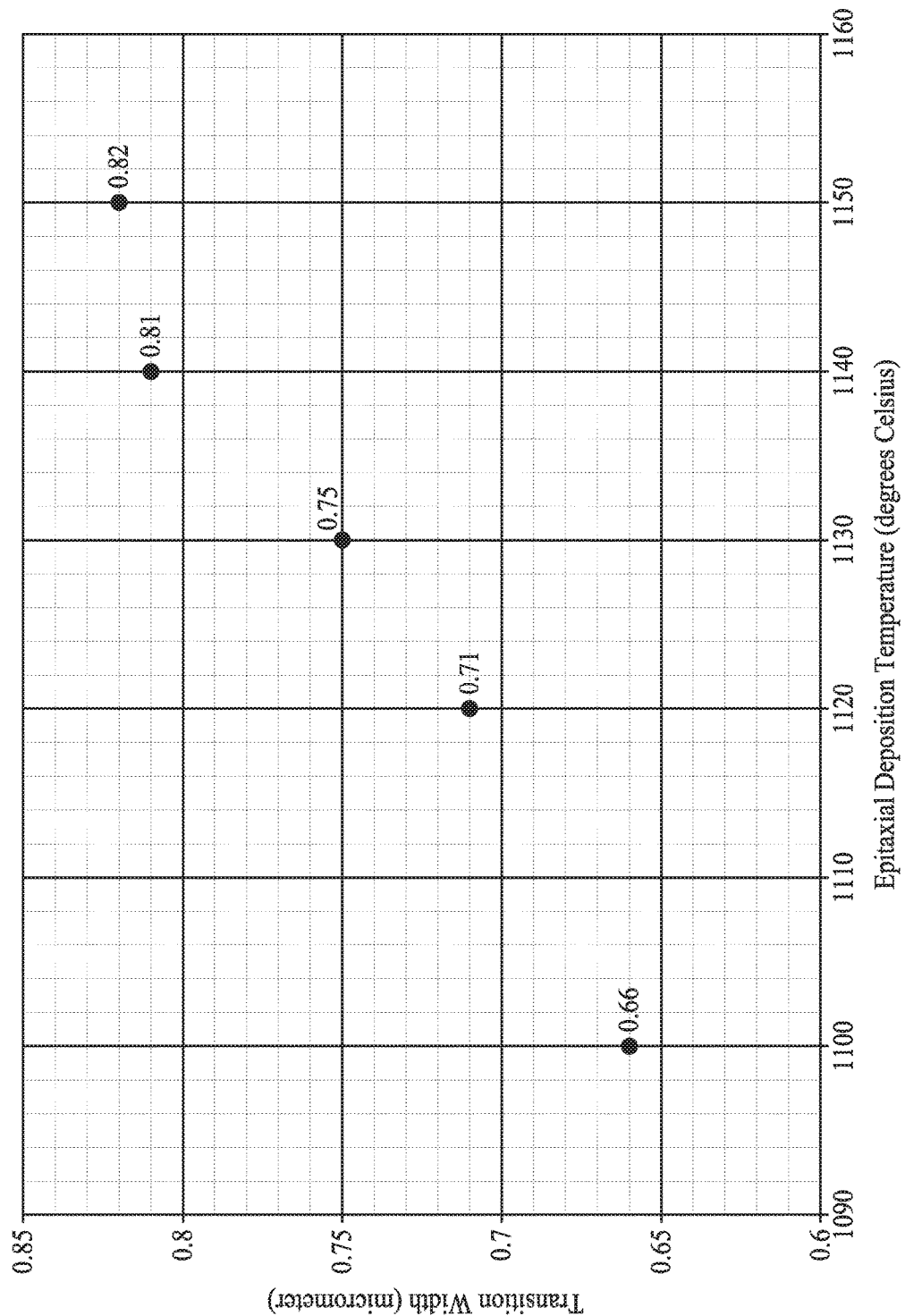
FIG. 12 is a diagram showing transition width with respect to various deposition temperatures for an epitaxial layer over a front surface of the wafer, in accordance with some embodiments of the present disclosure.

FIG. 12 is a diagram showing transition width with respect to various deposition temperatures for the epitaxial layer 205 over a front surface 200A of the semiconductor wafer 200. It is shown in FIG. 12 that a 0.71 μm transition width TW could be correlated with a deposition temperature for the epitaxial layer 205 at 1120° C., and a 0.75 μm transition width TW could be correlated with a deposition temperature for the epitaxial layer 205 at 1130° C. Referring back to FIG. 11, the device failure rate demonstrates a sudden drop after passing a transition width TW of 0.75 μm, therefore, a temperature for the epitaxial layer 205 at 1130° C. is provided to obtain the 0.75 μm transition width TW.

It is also shown in FIG. 12 that a 0.81 μm transition width TW could be correlated with a deposition temperature for the epitaxial layer 205 at 1140° C., and a 0.82 μm transition width TW could be correlated with a deposition temperature for the epitaxial layer 205 at 1150° C. The variation of the transition width TW gradually saturates around these two temperatures 1140° C. and 1150° C. Since further increment of the deposition temperature for the epitaxial layer 205 does not significantly increase the transition width TW, a temperature of 1160° C. is considered to be an upper limit of the preferred temperature range for epitaxial layer 205 growth.

Referring to FIG. 11 and FIG. 12, the critical significance of the deposition temperature for the epitaxial layer 205 to be within 1130° C. and 1160° C. could be understood by people having ordinary skill in the art.

In some embodiments, a method for manufacturing a semiconductor wafer with an epitaxial layer at a front surface of the semiconductor wafer includes providing the semiconductor wafer with a first dopant concentration of a dopant having a first conductivity type, forming a polysilicon layer over the front surface, forming an oxide layer over a back surface of the semiconductor wafer, removing the polysilicon layer from the front surface, depositing the epitaxial layer at the front surface with a second dopant concentration of the dopant having the first conductivity type under a predetermined temperature, the second dopant concentration being lower than the first dopant concentration. A transition width of the dopant having the first conductivity type across the semiconductor wafer and the epitaxial layer is controlled by the predetermined temperature to be at least about 0.75 micrometer.

In some embodiments, a semiconductor device includes a semiconductor wafer of a first conductivity type, an epitaxial layer of the first conductivity type over a front surface of the semiconductor wafer, and an device region in proximity to a top surface of the epitaxial layer, the top surface being away from the front surface of the semiconductor wafer. A defect density in a center portion of the semiconductor wafer is below $1E9/cm^3$ from a cross sectional perspective In some embodiments, a semiconductor wafer with an epitaxial layer at a front surface of the semiconductor wafer includes the semiconductor wafer with a first boron concentration, a polysilicon layer over a back surface of the semiconductor wafer, an oxide layer over the polysilicon layer, and the epitaxial layer at the front surface with a second boron concentration, the second boron concentration being lower than the first boron concentration. A transition width of boron across the semiconductor wafer and the epitaxial layer is at least about 0.75 micrometer.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor wafer with an epitaxial layer at a front surface of the semiconductor wafer, comprising:
   providing the semiconductor wafer with a first dopant concentration of a dopant having a first conductivity type;
   forming a polysilicon layer over the front surface;
   forming an oxide layer over a back surface of the semiconductor wafer;
   removing the polysilicon layer from the front surface; and
   depositing the epitaxial layer at the front surface with a second dopant concentration of the dopant having the first conductivity type under a predetermined temperature, the second dopant concentration being lower than the first dopant concentration,
   wherein a defect density in a center portion of the semiconductor wafer is below $1E9/cm^3$ from a cross sectional perspective after depositing the epitaxial layer at the front surface.

2. The method of claim 1, wherein the predetermined temperature is in a range of from about 1130° C. to about 1160° C.

3. The method of claim 1, wherein the forming the polysilicon layer further comprises depositing the polysilicon layer over the back surface of the semiconductor wafer in a furnace.

4. The method of claim 1, wherein the depositing the epitaxial layer comprises performing a chemical vapor deposition operation.

5. The method of claim 4, wherein the depositing the epitaxial layer comprises forming the epitaxial layer of at least 4 micrometer.

6. The method of claim 1, wherein the dopant having the first conductivity type comprises boron.

7. The method of claim 1, wherein a defect density in an edge portion of the semiconductor wafer is below $5E8/cm^3$ from a cross sectional perspective.

8. The method of claim 1, wherein an average defect size in a center portion of the semiconductor wafer is below 60 nm from a cross sectional perspective.

9. The method of claim 8, wherein an average defect size in an edge portion of the semiconductor wafer is below 55 nm from a cross sectional perspective.

10. The method of claim 1, wherein a transition width of the dopant having the first conductivity type across the semiconductor wafer and the epitaxial layer is controlled by the predetermined temperature to be at least about 0.75 micrometer.

11. A method of manufacturing a semiconductor wafer, comprising:
    providing the semiconductor wafer having a first conductivity type;
    forming a polysilicon layer at a back surface of the semiconductor wafer;
    forming an epitaxial layer of the first conductivity type over a front surface of the semiconductor wafer,
    wherein a defect density in a center portion of the semiconductor wafer is below $1E9/cm^3$ from a cross sectional perspective after forming the epitaxial layer.

12. The method of claim 11, further comprising forming a device region in proximity to a top surface of the epitaxial layer, the top surface of the epitaxial layer being away from the front surface of the semiconductor wafer.

13. The method of claim 12, wherein a transition width of a dopant of the first conductivity type across the semiconductor wafer and the epitaxial layer is at least of 0.75 micrometer.

14. The method of claim 11, wherein the polysilicon layer is formed at the back surface of the semiconductor wafer prior to forming the epitaxial layer.

15. The method of claim 14, further comprising forming an oxide layer at the back surface of the semiconductor wafer over the polysilicon layer.

16. A method of manufacturing a semiconductor wafer, comprising:
    providing the semiconductor wafer with a first boron concentration;
    forming a polysilicon layer over a back surface of the semiconductor wafer;
    forming an oxide layer over the polysilicon layer; and
    forming an epitaxial layer with a second boron concentration at a front surface of the semiconductor wafer, the second boron concentration being lower than the first boron concentration,
    wherein a defect density in a center portion of the semiconductor wafer is below $1E9/cm^3$ from a cross sectional perspective after forming the epitaxial layer.

17. The method of claim 16, wherein a defect density in an edge portion of the semiconductor wafer is below $5E8/cm^3$ from a cross sectional perspective.

18. The method of claim 16, wherein an average defect size in a center portion of the semiconductor wafer is below 60 nm from a cross sectional perspective.

19. The method of claim 18, wherein an average defect size in an edge portion of the semiconductor wafer is below 55 nm from a cross sectional perspective.

20. The method of claim 16, wherein a transition width of boron across the semiconductor wafer and the epitaxial layer is at least about 0.75 micrometer.

* * * * *